US010600894B2

(12) United States Patent
Goktepeli et al.

(10) Patent No.: US 10,600,894 B2
(45) Date of Patent: Mar. 24, 2020

(54) BIPOLAR JUNCTION TRANSISTOR AND METHOD OF FABRICATING THE SAME

(71) Applicant: QUALCOMM Incorporated, San Diego, CA (US)

(72) Inventors: Sinan Goktepeli, San Diego, CA (US); Plamen Vassilev Kolev, San Diego, CA (US); Peter Graeme Clarke, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/027,002

(22) Filed: Jul. 3, 2018

(65) Prior Publication Data

US 2020/0013884 A1    Jan. 9, 2020

(51) Int. Cl.
*H01L 29/737* (2006.01)
*H01L 29/417* (2006.01)
*H01L 29/423* (2006.01)
*H01L 29/06* (2006.01)
*H01L 29/10* (2006.01)
*H01L 29/08* (2006.01)
*H01L 29/45* (2006.01)
(Continued)

(52) U.S. Cl.
CPC .... *H01L 29/7371* (2013.01); *H01L 21/02164* (2013.01); *H01L 21/30625* (2013.01); *H01L 21/31053* (2013.01); *H01L 21/76224* (2013.01); *H01L 29/0649* (2013.01); *H01L 29/0817* (2013.01); *H01L 29/0821* (2013.01); *H01L 29/1012* (2013.01); *H01L 29/1095* (2013.01); *H01L 29/41708* (2013.01); *H01L 29/42304* (2013.01); *H01L 29/45* (2013.01); *H01L 29/66242* (2013.01)

(58) Field of Classification Search
CPC ........... H01L 29/7371; H01L 29/42304; H01L 29/0821; H01L 29/0817; H01L 29/1095; H01L 21/31053; H01L 21/02164; H01L 29/1012; H01L 29/41708; H01L 29/66242; H01L 21/30625; H01L 21/76224; H01L 29/0649; H01L 29/45
See application file for complete search history.

(56) References Cited

U.S. PATENT DOCUMENTS 6,084,284 A    7/2000  Adamic et al.
7,863,644 B1 *  1/2011  Yegnashankaran ... H01L 21/743
                                                                257/137

(Continued)

FOREIGN PATENT DOCUMENTS

EP    2913847 A1    9/2015

OTHER PUBLICATIONS

International Search Report and Written Opinion—PCT/US2019/039256—ISA/EPO—dated Oct. 14, 2019.

(Continued)

*Primary Examiner* — Victor A Mandala

(57) ABSTRACT

A Bipolar Junction Transistor (BJT) comprises an emitter, a collector, and a base between the emitter and the collector. The BJT also comprises an emitter contact on a first side of the BJT, a base contact on the first side of the BJT, and a collector contact on a second side of the BJT. The BJT further comprises a Deep Trench Isolation (DTI) region extending from the first side of the BJT to the second side of the BJT.

9 Claims, 7 Drawing Sheets

(51) Int. Cl.
*H01L 29/66* (2006.01)
*H01L 21/762* (2006.01)
*H01L 21/3105* (2006.01)
*H01L 21/306* (2006.01)
*H01L 21/02* (2006.01)

(56) References Cited

U.S. PATENT DOCUMENTS

| | | | | |
|---|---|---|---|---|
| 9,570,494 B1* | 2/2017 | Jerome | ............... | H01L 27/1463 |
| 10,446,644 B2* | 10/2019 | Camillo-Castillo | ......................... | H01L 21/762 |
| 10,453,919 B2* | 10/2019 | Chevalier | ........... | H01L 29/0821 |
| 2006/0197185 A1 | 9/2006 | Chung | | |
| 2011/0127615 A1* | 6/2011 | Tanaka | ................ | H01L 21/8249 257/378 |
| 2012/0086045 A1* | 4/2012 | Molin | ................ | H01L 29/7802 257/139 |
| 2012/0217574 A1* | 8/2012 | Kumano | ............. | H01L 27/0623 257/327 |
| 2014/0015090 A1* | 1/2014 | Lin | ................... | H01L 29/66272 257/495 |
| 2014/0054747 A1* | 2/2014 | Lin | ..................... | H01L 29/6625 257/565 |
| 2016/0190293 A1* | 6/2016 | Wu | ..................... | H01L 21/2855 257/197 |
| 2017/0373175 A1 | 12/2017 | Gu et al. | | |
| 2018/0197950 A1* | 7/2018 | Natsume | ................. | H01L 27/06 |

OTHER PUBLICATIONS

Mulay A., et al., "Switching Dynamics of Power Bipolar Transistor in High-Frequency Electronic Ballast", The 1998 IEEE Industry Applications Conference, Thirty-Third IAS Annual Meeting, St. Louis, MO, USA, Oct. 12-15, 1998, New York, NY, USA, IEEE, US, Oct. 12, 1998 (Oct. 12, 1998), pp. 2130-2136, vol. 3, XP032135463, DOI: 10.1109/IAS.1998.729990, ISBN: 978-0-7803-4943-8, Chapter "II. Device Characterization"; figure 1.

* cited by examiner

BIPOLAR JUNCTION TRANSISTOR AND METHOD OF FABRICATING THE SAME

BACKGROUND

Field

Certain aspects of the present disclosure generally relate to Bipolar Junction Transistors (BJT), and more particularly, to BJT with backside contacts.

Background

Bipolar Junction Transistor (BJT) is a semiconductor device which has three doped semiconductor regions separated by two p-n junctions. The three semiconductor regions include an emitter, a collector, and a base between the emitter and the collector. In a BJT, current is carried by both electrons and holes. BJT is extensively used in amplifiers and switches.

FIG. 1 illustrates an exemplary BJT 100. The BJT 100 comprises a P-type semiconductor substrate 102, an N-type collector 104, an N-type emitter 108, and a P-type base 106 between the N-type collector 104 and the N-type emitter 108. The BJT 100 also comprises a Silicon Dioxide ($SiO_2$) layer 110 and three contacts 112, 114, and 116 for the N-type collector 104, the P-type base 106, and the N-type emitter 108, respectively. The three contacts 112, 114, and 116 are all on a first side of the BJT 100. For carriers in the N-type collector 104 to travel to the contact 112, they would have to travel both horizontally and vertically. Thus, a parasitic PNP transistor would form among the P-type base 106, the N-type collector 104, and the P-type semiconductor substrate 102. The parasitic PNP transistor would affect performance of the BJT 100. To prevent the formation of the parasitic PNP transistor, the BJT 100 would occupy a large area on an integrated circuit, which would make it incompatible with design requirements. Thus, there is a need to develop a BJT with compact size and no parasitic transistors.

SUMMARY

Certain aspects of the present disclosure provide a Bipolar Junction Transistor (BJT). The BJT may include an emitter, a collector, and a base between the emitter and the collector. The BJT may also include an emitter contact on a first side of the BJT, a base contact on the first side of the BJT, and a collector contact on a second side of the BJT, wherein the second side is opposite to the first side. The BJT may further include a Deep Trench Isolation (DTI) region extending from the first side of the BJT to the second side of the BJT.

Certain aspects of the present disclosure provide a method for fabricating a Bipolar Junction Transistor (BJT). The method may include forming an emitter, a collector, and a base between the emitter and the collector on a semiconductor substrate. The method may also include forming an emitter contact layer, an emitter contact, a base contact layer, and a base contact on a first side of the semiconductor substrate. The method may also include forming a Deep Trench Isolation (DTI) region extending from the first side of the semiconductor substrate to a second side of the semiconductor substrate, the second side opposite to the first side. The method may also include forming a first dielectric layer on the first side of the semiconductor substrate and bonding a handle substrate to the first dielectric layer. The method may also include exposing the DTI region and the collector on the second side of the semiconductor substrate and forming a collector contact layer and a collector contact on the second side of the semiconductor substrate. The method may also include forming a trench interconnect through the DTI region extending from the first side of the semiconductor substrate to the second side of the semiconductor substrate. The method may further include forming a second dielectric layer on the second side of the semiconductor substrate.

This summary has outlined, rather broadly, the features and embodiments of the present disclosure so that the following detailed description may be better understood. Additional features and embodiments of the present disclosure will be described below. It should be appreciated by those skilled in the art that this disclosure may be readily utilized as a basis for modifying or designing other equivalent structures for carrying out the same purposes of the present disclosure. It should also be realized by those skilled in the art that such equivalent constructions do not depart from the teachings of the present disclosure as set forth in the appended claims. The features, which are believed to be characteristic of the present disclosure, both as to its organization and method of operation, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
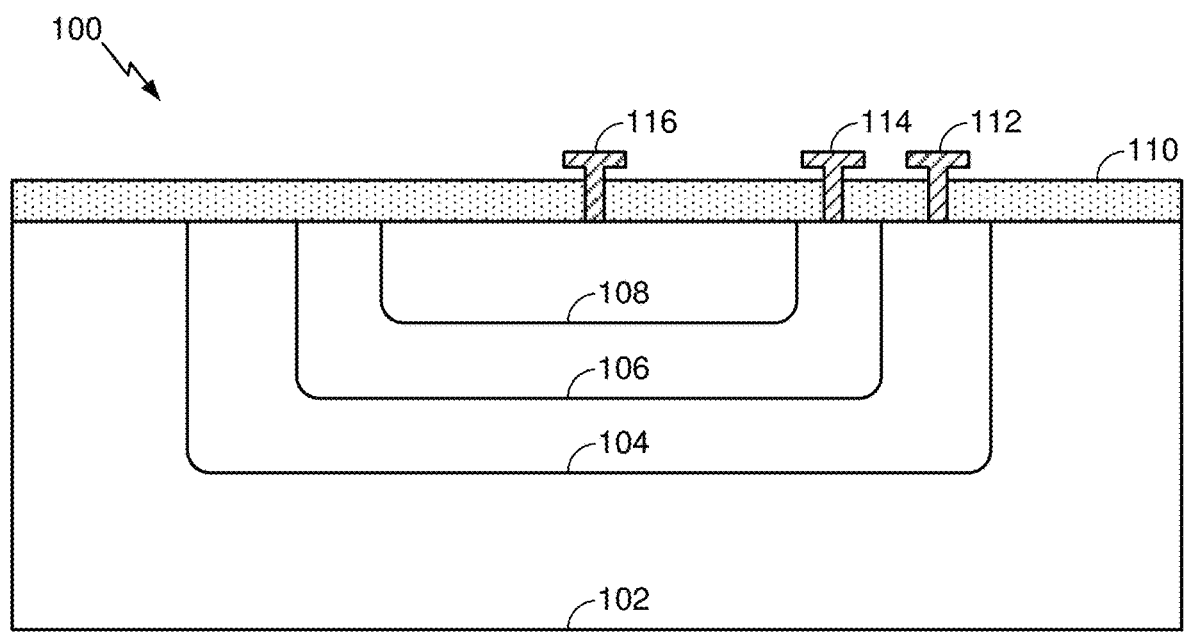
FIG. 1 illustrates an exemplary Bipolar Junction Transistor (BJT)

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The detailed description set forth below, in connection with the appended drawings, is intended as a description of various aspects and is not intended to represent the only aspect in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Figure 2:
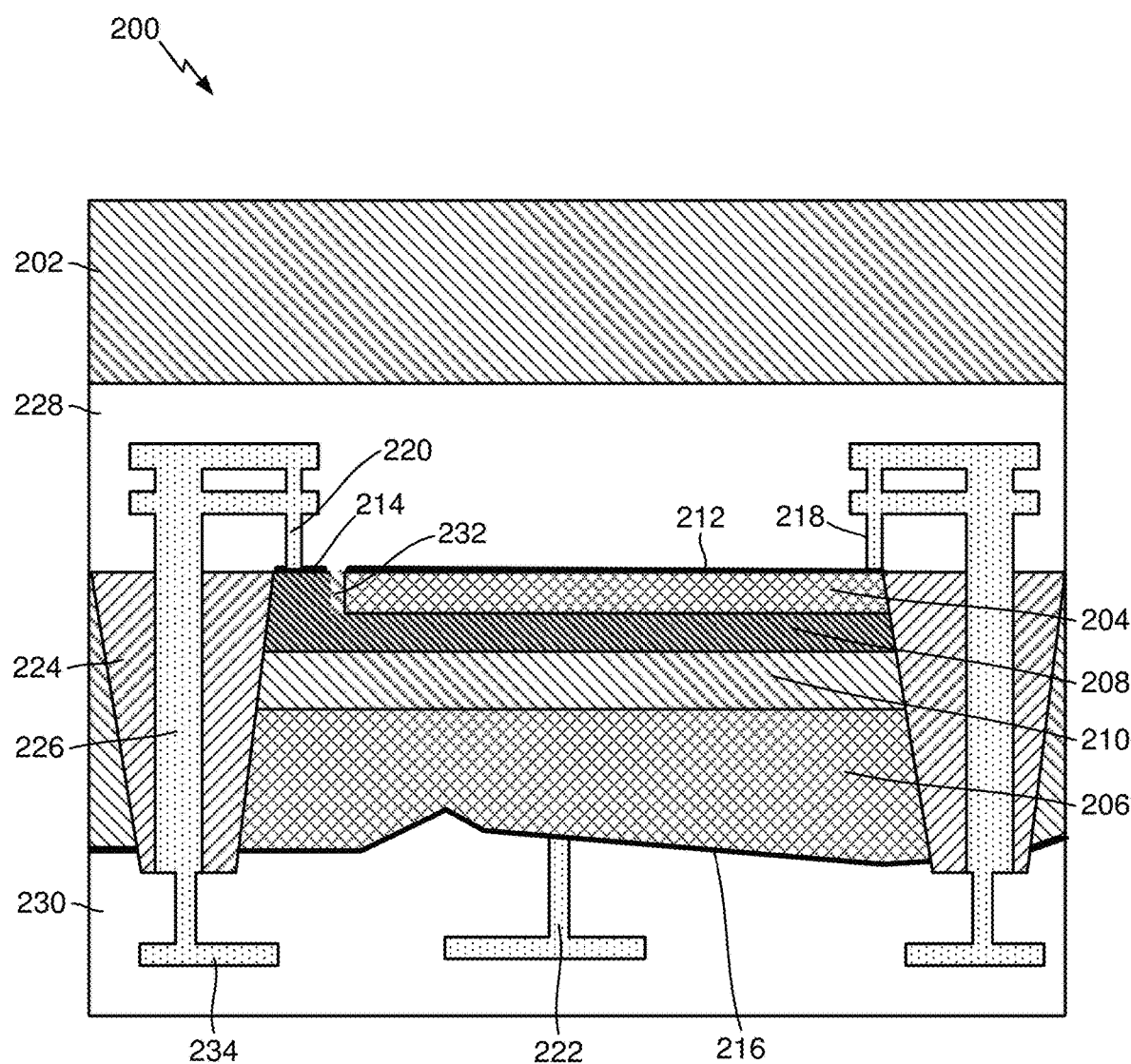
FIG. 2 illustrates an exemplary BJT with no parasitic transistors in accordance with certain aspects of the present disclosure.

FIG. 2 illustrates an exemplary Bipolar Junction Transistor (BJT) with no parasitic transistors in accordance with certain aspects of the present disclosure. A BJT 200 is shown in FIG. 2, which comprises an emitter 204, a collector 206, and a base 208 between the emitter 204 and the collector 206. As an example, the emitter 204 may comprise an N+ Silicon (Si) emitter, the collector 206 may comprise an N+ Si collector, and the base 208 may comprise a P Si base. Alternatively, the emitter 204, the collector 206, and the base 208 may comprise Silicon Germanium (SiGe) or other semiconductor materials, such as III-V semiconductor materials. If the emitter 204, the collector 206, and the base 208 comprise III-V semiconductor materials, the BJT 200 may comprise a Heterojunction Bipolar Transistor (HBT). The BJT 200 may also comprise a drift region 210 between the base 208 and the collector 206. As an example, the drift region 210 may comprise an N– Si drift region. The drift region 210 may be used to increase breakdown voltage of the BJT 200. Although the BJT 200 in FIG. 2 is shown as an NPN BJT, the BJT 200 may also be configured as a PNP BJT. The BJT 200 also comprises an emitter contact layer 212, an emitter contact 218, a base contact layer 214, and a base contact 220 on a first side of the BTJ 200. As an example, the emitter contact layer 212 may comprise silicide, the emitter contact 218 may comprise Tungsten (W), the base contact layer 214 may comprise silicide, and the base contact 220 may comprise W. The BJT 200 also comprises a collector contact layer 216 and a collector contact 222 on a second side of the BJT 200, wherein the second side is opposite to the first side. As an example, the collector contact layer 216 may comprise silicide and the collector contact 222 may comprise W, Copper (Cu), Cobalt (Co), or Aluminum (Al).

In the BJT 200, there is no semiconductor substrate in contact with the collector 206. Thus, there are no parasitic transistors formed in the BJT 200, which would improve performance of the BJT 200. The collector contact 222 is on the second side of the BJT 200. Carriers in the collector 206 would travel to the second side of the BJT 200. The emitter contact 218 and the base contact 220 are on the first side of the BJT 200. Carriers in the emitter 204 and the base 208 would travel to the first side of the BJT 200. Thus, the BJT 200 would have low parasitic collector-base capacitance, which would also improve the performance of the BJT 200. The BJT 200 would also have a compact size and low parasitic collector resistance, because the collector 206 is accessed directly from the second side of the BJT 200.

With continuing reference to FIG. 2, the BJT 200 also comprises a Deep Trench Isolation (DTI) region 224 extending from the first side of the BJT 200 to the second side of the BJT 200. The DTI region 224 may isolate the BJT 200 from other devices on an integrated circuit. As an example, the DTI region 224 may comprise Silicon Dioxide ($SiO_2$). The BJT 200 also comprises a trench interconnect 226 extending through the DTI region 224 from the first side of the BJT 200 to the second side of the BJT 200. The trench interconnect 226 may couple the base contact 220 on the first side of the BJT 200 to a trench interconnect contact 234 on the second side of the BJT 200. Thus, the base contact 220 may be accessed at the second side of the BJT 200 through the trench interconnect 226 and the trench interconnect contact 234. A similar structure may be used for the emitter contact 218 to be accessed at the second side of the BJT 200. As an example, the trench interconnect 226 may comprise W or Cu and the trench interconnect contact 234 may comprise W, Cu, Co, or Al. The BJT 200 further comprises a first dielectric layer 228 on the first side of the BJT 200 and a second dielectric layer 230 on the second side of the BJT 200. As an example, the first dielectric layer 228 may comprise nitride, oxide, low-k dielectrics, or Borophosphosilicate Glass (BPSG) and the second dielectric layer 230 may comprise nitride, oxide, low-k dielectrics, or BPSG. The BJT 200 may also comprise a handle substrate 202 on the first dielectric layer 228. As an example, the handle substrate 202 may comprise Si or other semiconductor materials. The BJT 200 may further comprise an isolation structure 232 to separate the emitter contact layer 212 from the base contact layer 214. As an example, the isolation structure 232 may comprise a dummy polysilicon structure or a Shallow Trench Isolation (STI) region.

Figure 3:
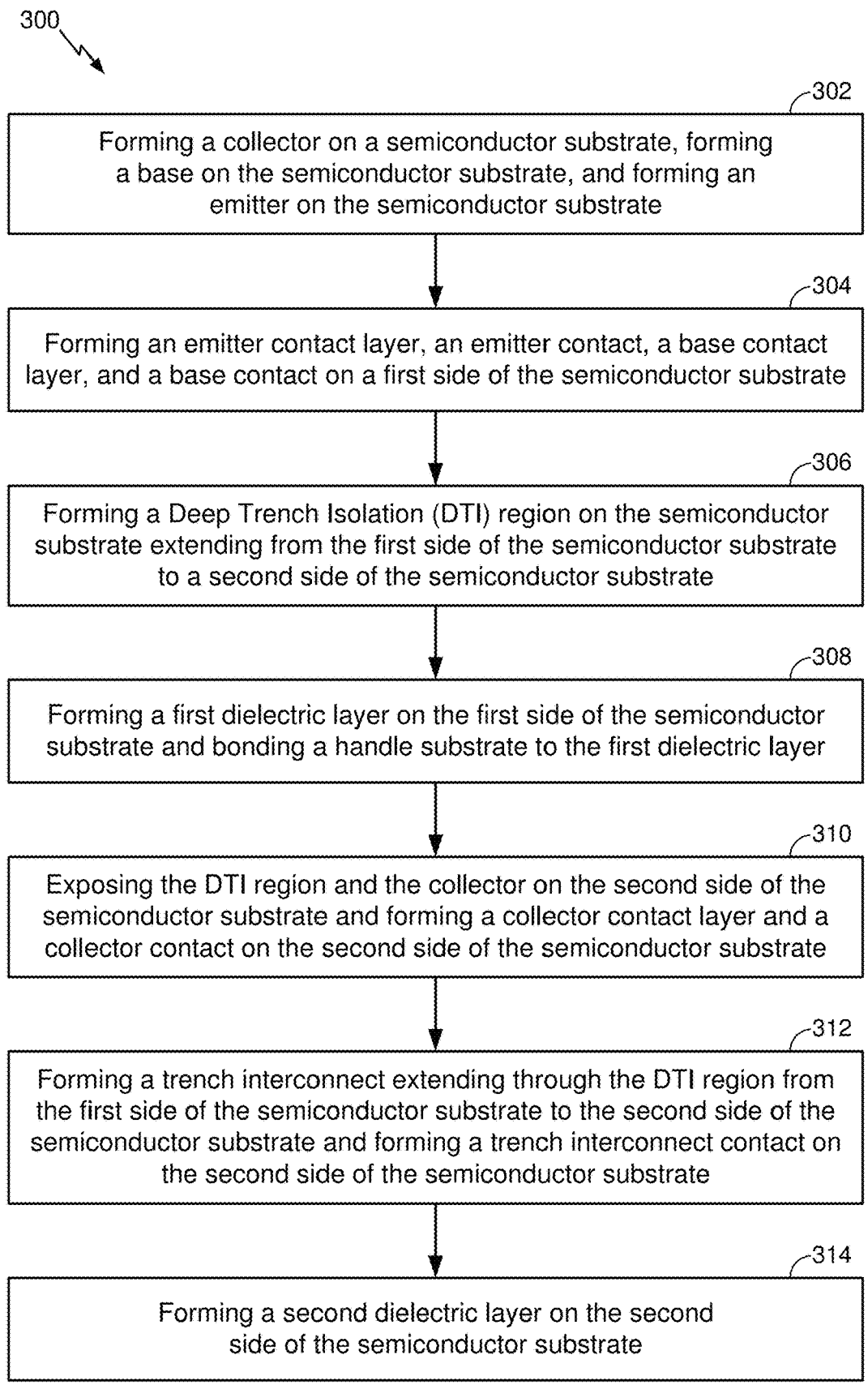
FIG. 3 provides a flow chart illustrating an exemplary fabrication process for the BJT of FIG. 2 in accordance with certain aspects of the present disclosure.

FIG. 3 illustrates an exemplary fabrication process 300 for the BJT 200 in FIG. 2 in accordance with certain aspects of the present disclosure. Block 302 includes forming a collector on a semiconductor substrate. As an example, the semiconductor substrate may comprise Si, SiGe, or other semiconductor materials, such as III-V semiconductor materials. The collector may comprise an N+ Si collector. The collector may be formed by ion implantation from both a first side of the semiconductor substrate and a second side of the semiconductor substrate, wherein the second side is opposite to the first side. Alternatively, the collector may be formed by epitaxy growth on the first side of the semiconductor substrate. Block 302 also includes forming a base on the semiconductor substrate. As an example, the base may comprise a P Si base. The base may be formed by ion implantation from the first side of the semiconductor substrate. Alternatively, the base may be formed by epitaxy growth on the first side of the semiconductor substrate. Either way, the base would have a well-controlled doping profile. A drift region may be formed between the base and the collector. As an example, the drift region may comprise an N– Si drift region. The drift region may be formed by ion implantation from the first side of the semiconductor substrate. Alternatively, the drift region may be formed by epitaxy growth on the first side of the semiconductor substrate. An isolation structure may be formed on the first side of the semiconductor substrate. As an example, the isolation structure may comprise a dummy polysilicon structure or an STI region. Block 302 further includes forming an emitter on the semiconductor substrate. As an example, the emitter may comprise an N+ Si emitter. The emitter may be formed by ion implantation from the first side of the semiconductor substrate. Alternatively, the emitter may be formed by epitaxy growth on the first side of the semiconductor substrate. Either way, a junction between the emitter and the base would have a well-controlled doping profile.

Block 304 includes forming an emitter contact layer, an emitter contact, a base contact layer, and a base contact on the first side of the semiconductor substrate. As an example, the emitter contact layer may comprise silicide, the emitter contact may comprise W, the base contact layer may comprise silicide, and the base contact may comprise W. The emitter contact layer may be separated from the base contact layer by the isolation structure.

Block 306 includes forming a DTI region on the semiconductor substrate extending from the first side of the semiconductor substrate to the second side of the semiconductor substrate. The DTI region may extend through the emitter, the base, the drift region, and the collector. As an example, the DTI region may comprise $SiO_2$. The DTI region isolates the BJT 200 from other devices on the semiconductor substrate.

Block 308 includes forming a first dielectric layer on the first side of the semiconductor substrate and bonding a handle substrate to the first dielectric layer. As an example, the first dielectric layer may comprise nitride, oxide, low-k dielectrics, or BPSG and the handle substrate may comprise Si or other semiconductor materials.

Block 310 includes exposing the DTI region and the collector on the second side of the semiconductor substrate. As an example, the DTI region and the collector may be exposed on the second side of the semiconductor substrate through backgrinding followed by a wet etching or a Chemical Mechanical Polishing (CMP) process. Block 310 also includes forming a collector contact layer and a collector contact on the second side of the semiconductor substrate. As an example, the collector contact layer may comprise silicide and the collector contact may comprise W, Cu, Co, or Al.

Block 312 includes forming a trench interconnect extending through the DTI region from the first side of the semiconductor substrate to the second side of the semiconductor substrate and forming a trench interconnect contact on the second side of the semiconductor substrate. The trench interconnect may couple the emitter contact or the base contact to the trench interconnect contact. As an example, the trench interconnect may comprise W or Cu and the trench interconnect contact may comprise W, Cu, Co, or Al.

Block 314 includes forming a second dielectric layer on the second side of the semiconductor substrate. As an example, the second dielectric layer may comprise nitride, oxide, low-k dielectrics, or BPSG.

Figure 4A:
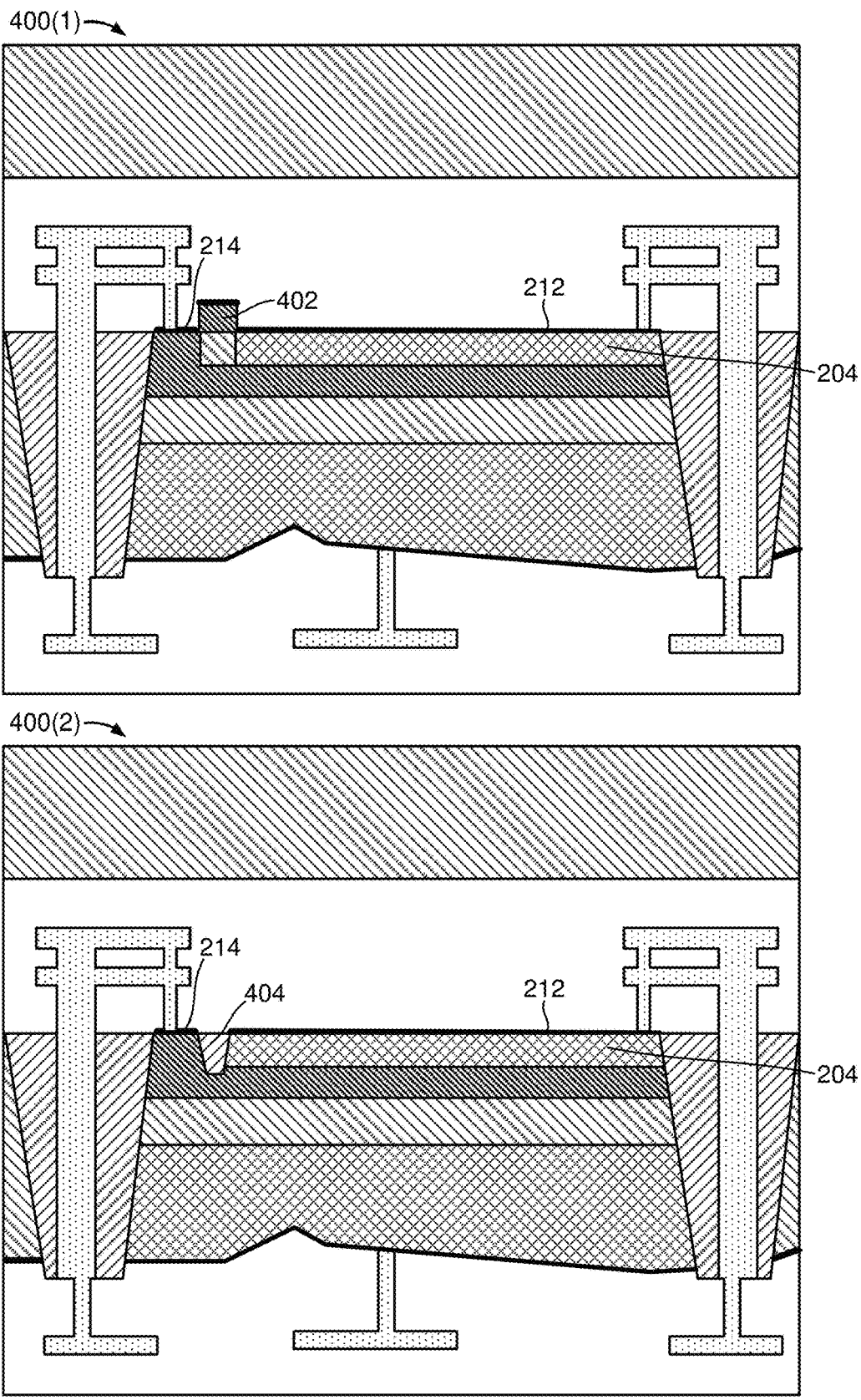
FIGS. 4A-4B illustrate several exemplary approaches to separate an emitter contact layer from a base contact layer in accordance with certain aspects of the present disclosure.
Figure 4B:
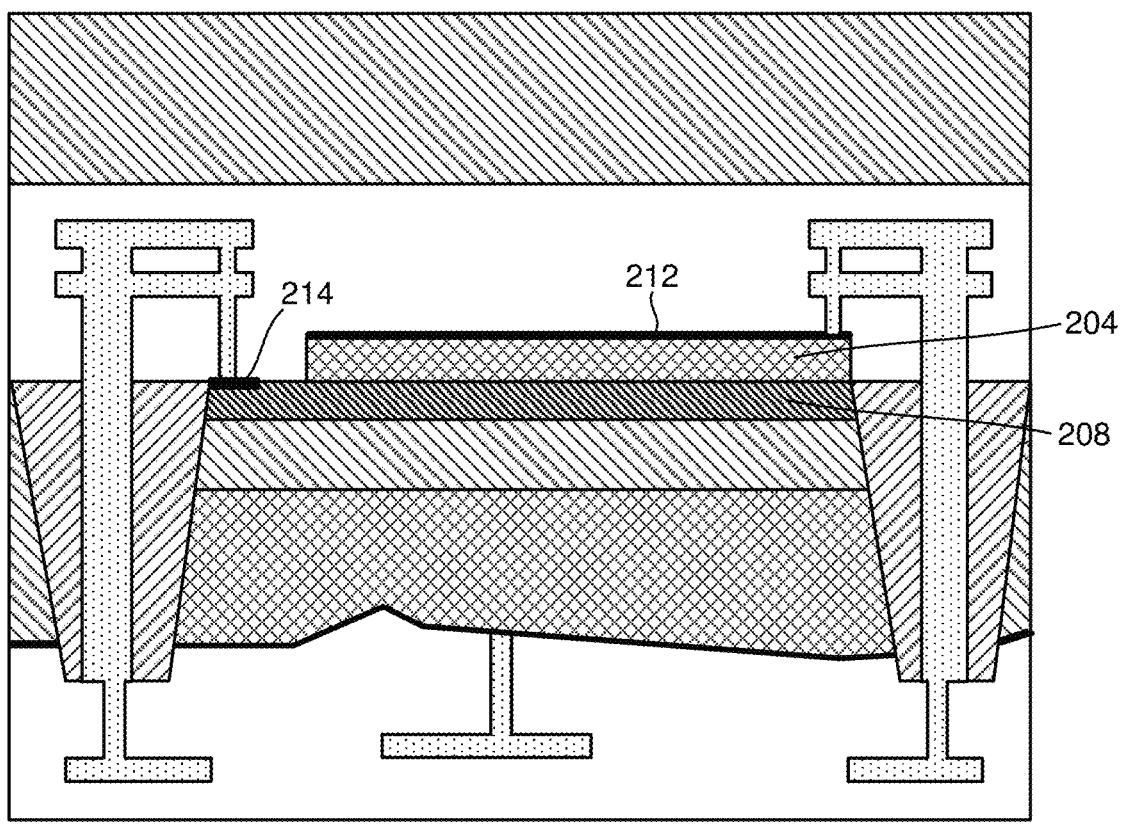

FIGS. 4A-4B illustrate several exemplary approaches to separate the emitter contact layer 212 from the base contact layer 214 in accordance with certain aspects of the present disclosure. In particular, in 400(1), the emitter 204 is formed by ion implantation on the first side of the semiconductor substrate. A dummy structure 402 is used to form an isolation structure (e.g., isolation structure 232) to separate the emitter contact layer 212 from the base contact layer 214. As an example, the dummy structure 402 may comprise polysilicon. During formation of the emitter 204, an area covered by the dummy structure 402 is not affected by ion implantation, which would be used to form the isolation structure. The emitter contact layer 212 would be formed on a first side of the dummy structure 402 and the base contact layer 214 would be formed on a second side of the dummy structure 402. An ion implantation step may be performed on the second side of the dummy structure 402 before formation of the base contact layer 214. Thus, the emitter contact layer 212 is separated from the base contact layer 214 by the isolation structure, which comprises the dummy structure 402 and the area covered by it.

In 400(2), the emitter 204 is formed by ion implantation on the first side of the semiconductor substrate. An STI region 404 is used to form an isolation structure (e.g., isolation structure 232) to separate the emitter contact layer 212 from the base contact layer 214. As an example, the STI region 404 may comprise $SiO_2$. During formation of the emitter 204, the STI region 404 is not affected by ion implantation. The emitter contact layer 212 would be formed on a first side of the STI region 404 and the base contact layer 214 would be formed on a second side of the STI region 404. An ion implantation step may be performed on the second side of the STI region 404 before formation of the base contact layer 214. Thus, the emitter contact layer 212 is separated from the base contact layer 214 by the isolation structure, which comprises the STI region 404.

In 400(3), the emitter 204 is formed by epitaxy growth on the first side of the semiconductor substrate. An isolation structure is not required to separate the emitter contact layer 212 from the base contact layer 214. As an example, during formation of the emitter 204, the emitter 204 would be patterned such that a size of the emitter 204 is smaller than a size of the base 208. The emitter contact layer 212 would be formed on the emitter 204 and the base contact layer 214 would be formed on the base 208 respectively. The emitter contact layer 212 and the base contact layer 214 is separated from each other because of different sizes of the emitter 204 and the base 208. Thus, no isolation structure is required.

Figure 5:
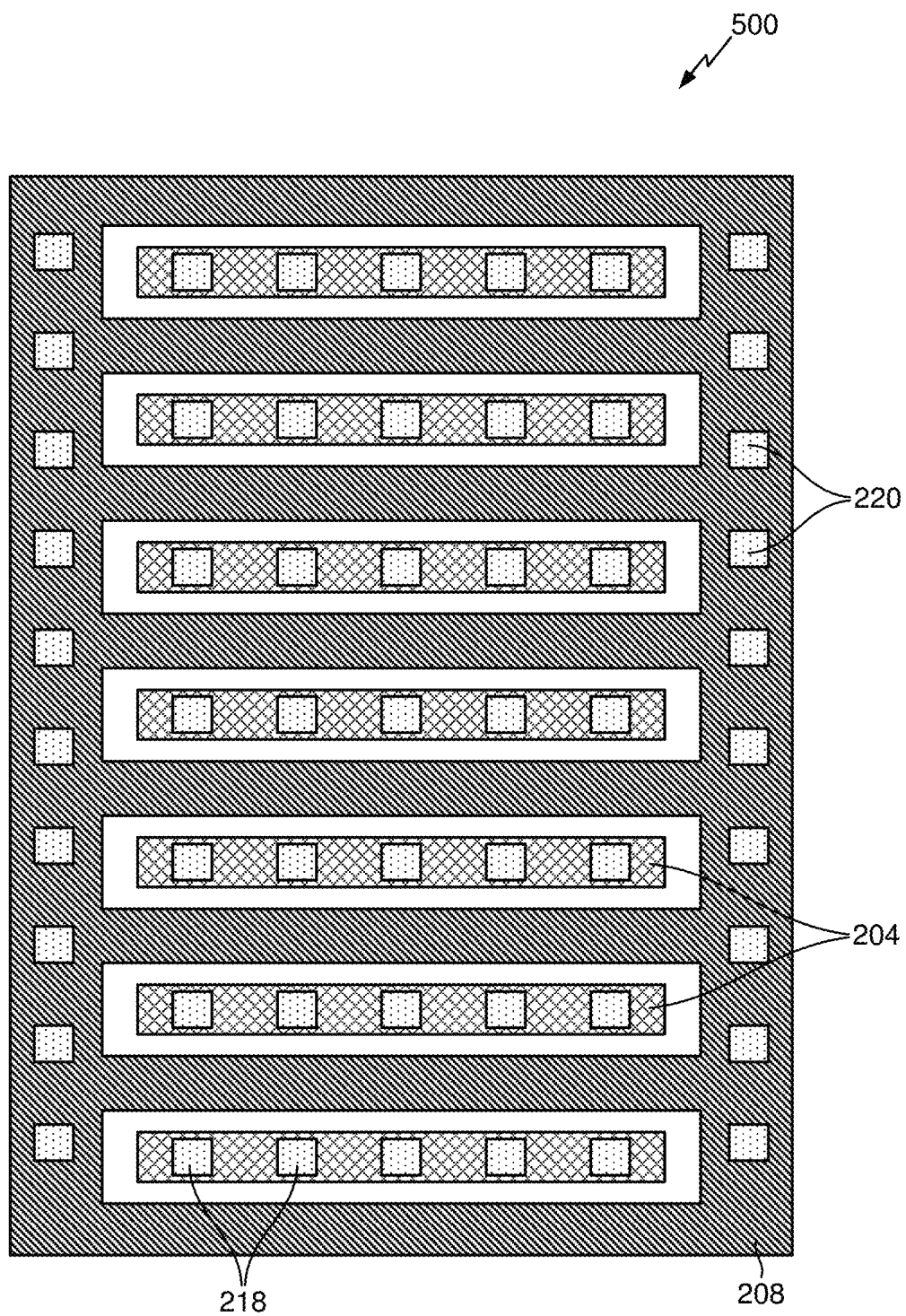
FIG. 5 illustrates an exemplary top-down view of the BJT of FIG. 2 in a multi-finger configuration in accordance with certain aspects of the present disclosure.

FIG. 5 illustrates an exemplary top-down view 500 of the BJT 200 in FIG. 2 in a multi-finger configuration in accordance with certain aspects of the present disclosure. The first side of the BJT 200 is shown in FIG. 5, which comprises the emitter 204, the base 208, the emitter contact 218, and the base contact 220. The base 208 may be symmetric in shape. The emitter contact 218 may distribute across the emitter 204 to minimize parasitic emitter resistance. The base contact 220 may distribute along two edges of the base 208 to minimize parasitic base resistance. There is no collector contact on the first side of the BJT 200. Thus, parasitic collector-base capacitance would be small. All these factors would contribute to improve the performance of the BJT 200.

The elements described herein are sometimes referred to as means for performing particular functions. In this regard, the emitter contact 218, the base contact 220, and the collector contact 222 are sometimes referred to herein as "means for contacting." The DTI region 224 is sometimes referred to herein as "means for isolating." According to a further aspect of the present disclosure, the aforementioned means may be any layer, module, or any apparatus configured to perform the functions recited by the aforementioned means.

The BJT with no parasitic transistors according to certain aspects disclosed herein may be provided in or integrated into any electronic device. Examples, without limitation, include a set top box, an entertainment unit, a navigation device, a communication device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, and a drone.

Figure 6:
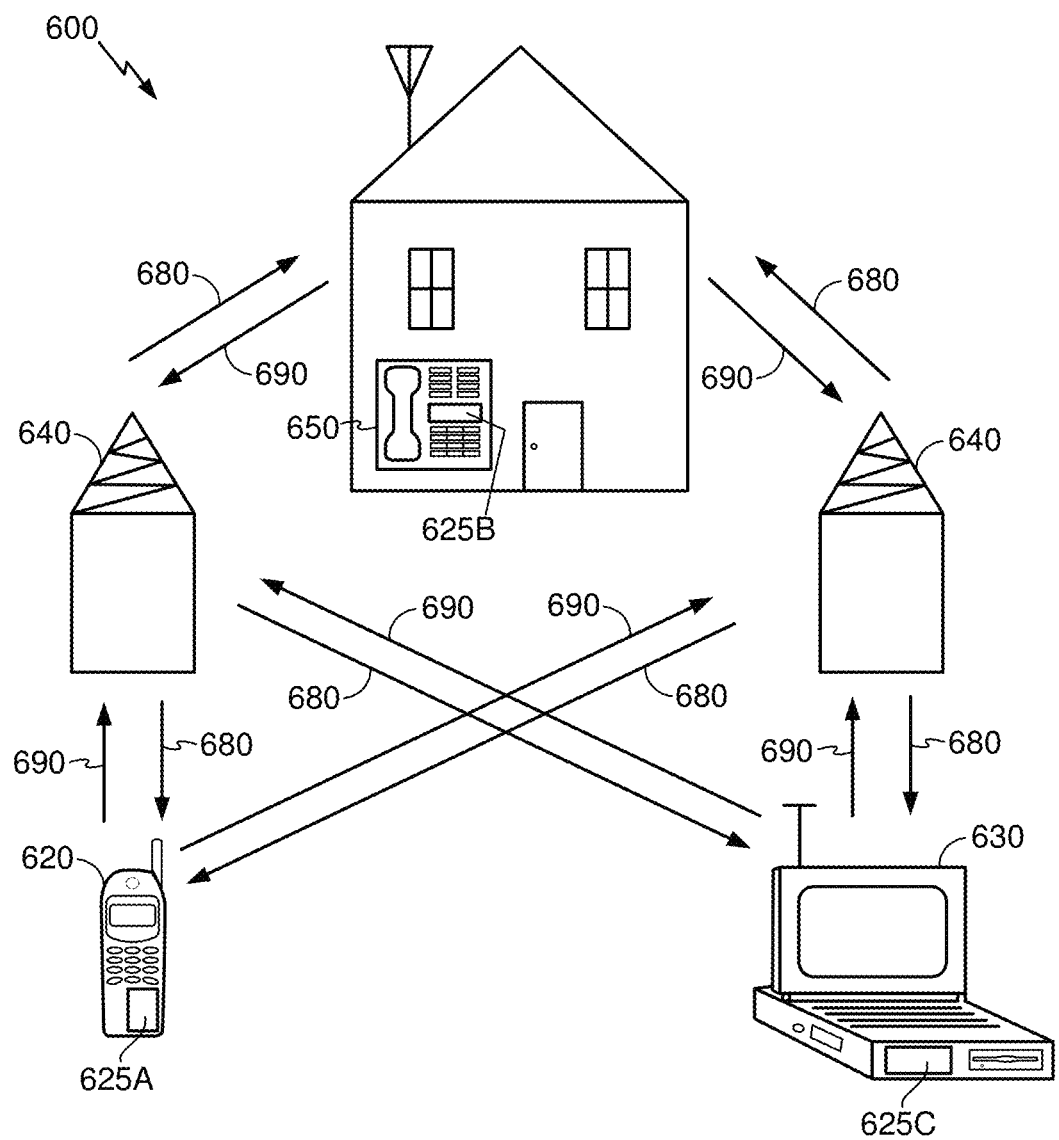
FIG. 6 is a block diagram showing an exemplary wireless communication system in which an aspect of the present disclosure may be employed.

FIG. 6 is a block diagram showing an exemplary wireless communication system 600 in which an aspect of the present disclosure may be employed. For purposes of illustration, FIG. 6 shows three remote units 620, 630, and 650 and two base stations 640. It will be recognized that wireless communication systems may have many more remote units and base stations. Remote units 620, 630, and 650 include integrated circuit (IC) devices 625A, 625C, and 625B that may include the disclosed BJT. It will be recognized that other devices may also include the disclosed BJT, such as the base stations, switching devices, and network equipment. FIG. 6 shows forward link signals 680 from the base stations 640 to the remote units 620, 630, and 650 and reverse link signals 690 from the remote units 620, 630, and 650 to the base stations 640.

In FIG. 6, remote unit 620 is shown as a mobile telephone, remote unit 630 is shown as a portable computer, and remote unit 650 is shown as a fixed location remote unit in a wireless local loop system. For example, a remote unit may be a mobile phone, a hand-held personal communication systems (PCS) unit, a portable data unit such as a PDA, a GPS enabled device, a navigation device, a set top box, a music player, a video player, an entertainment unit, a fixed location data unit, such as a meter reading equipment, or other communication device that stores or retrieves data or computer instructions, or combinations thereof. Although FIG. 6 illustrates remote units according to the certain aspects of the present disclosure, the disclosure is not limited to these exemplary illustrated units. Certain aspects of the present disclosure may be suitably employed in many devices, which include the disclosed BJT.

Those of skill in the art will further appreciate that the various illustrative logical blocks, modules, circuits, and algorithms described in connection with the certain aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and features disclosed herein.

What is claimed is:

1. A Bipolar Junction Transistor (BJT), comprising: an emitter; a collector; a base between the emitter and the collector; an emitter contact on a first side of the BJT; a base contact on the first side of the BJT; a collector contact on a second side of the BJT, wherein the second side is opposite to the first side; a Deep Trench Isolation (DTI) region extending from the first side of the BJT to the second side of the BJT; a trench interconnect extending through the DTI region from the first side of the BJT to the second side of the BJT; and a trench interconnect contact on the second side of the BJT, wherein the trench interconnect couples at least one of the emitter contact and the base contact to the trench interconnect contact.

2. The BJT of claim 1, further comprising a drift region between the base and the collector.

3. The BJT of claim 1, further comprising an emitter contact layer on the first side of the BJT; a base contact layer on the first side of the BJT; and a collector contact layer on the second side of the BJT.

4. The BJT of claim 3, further comprising an isolation structure separating the emitter contact layer from the base contact layer.

5. The BJT of claim 4, wherein the isolation structure comprises a Shallow Trench Isolation (STI) region.

6. The BJT of claim 4, wherein the isolation structure comprises a dummy polysilicon structure.

7. The BJT of claim 3, wherein the emitter contact layer, the base contact layer, and the collector contact layer comprise silicide.

8. The BJT of claim 1, wherein the BJT is a Heterojunction Bipolar Transistor (HBT).

9. The BJT of claim 1 integrated into a device selected from the group consisting of: a set top box; an entertainment unit; a navigation device; a communication device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; and a drone.

* * * * *